US010277982B2

United States Patent
Chambon

(10) Patent No.: US 10,277,982 B2
(45) Date of Patent: Apr. 30, 2019

(54) HIGH END AUDIO PREAMPLIFIER

(71) Applicant: AUDIO TECHNOLOGY SWITZERLAND S.A., Romanel-sur-Lausanne (CH)

(72) Inventor: Philippe Chambon, Romanel-sur-Lausanne (CH)

(73) Assignee: AUDIO TECHNOLOGY SWITZERLAND S.A., Romanel-sur-Lausanne (CH)

( * ) Notice: Subject to any disclaimer, the term of this patent is extended or adjusted under 35 U.S.C. 154(b) by 0 days.

(21) Appl. No.: 16/143,262

(22) Filed: Sep. 26, 2018

(65) Prior Publication Data

US 2019/0098406 A1  Mar. 28, 2019

(30) Foreign Application Priority Data

Sep. 28, 2017 (EP) ..................................... 17193757

(51) Int. Cl.
*H04R 3/04* (2006.01)
*H03G 3/30* (2006.01)

(52) U.S. Cl.
CPC ............. *H04R 3/04* (2013.01); *H03G 3/3005* (2013.01); *H03F 2200/03* (2013.01)

(58) Field of Classification Search
None
See application file for complete search history.

(56) References Cited

U.S. PATENT DOCUMENTS

2010/0259328 A1* 10/2010 Giovannotto ............. H03F 3/26
330/195
2013/0329912 A1* 12/2013 Krishnaswamy ........ H03G 3/20
381/107
2014/0112501 A1* 4/2014 Yeh ........................ H04R 1/005
381/122

* cited by examiner

*Primary Examiner* — Paul W Huber
(74) *Attorney, Agent, or Firm* — DLA Piper LLP (US)

(57) ABSTRACT

A preamplifier system to adjust the level of an audio signal, said system comprising a transient adjustment line and a steady adjustment line, each receiving the input of the preamplifier system, each adjustment line having an input and an output, said system further comprising a setting device to produce a setting adjustment value, a controller to receive the setting adjustment value and to control the transient adjustment line and the steady adjustment line, a switching module connected an output of the preamplifier system and to the output of the transient adjustment line and output of the steady adjustment line, the transient adjustment line being made of semiconductors and the steady adjustment line being made of a coil with multiple selectable windings.

5 Claims, 2 Drawing Sheets

HIGH END AUDIO PREAMPLIFIER

INTRODUCTION

The world of the very high end audio preamplifier is small. The task seems simple, adjusting the level of the audio signal. However, the challenge is to introduce no distortion or delay in the adjustment audio chain.

BRIEF DESCRIPTION OF THE INVENTION

In the frame of the present description it is proposed a preamplifier system to adjust the level of an audio signal, said system comprising a transient adjustment line and a steady adjustment line, each receiving the input of the preamplifier system, each adjustment line having an input and an output, said system further comprising a setting device to produce a setting adjustment value, a controller to receive the setting adjustment value and to control the transient adjustment line and the steady adjustment line, a switching module connected an output of the preamplifier system and to the output of the transient adjustment line and output of the steady adjustment line, the transient adjustment line being made of semiconductors and the steady adjustment line being made of a coil with multiple selectable windings, the controller being configured to:

detect a change of the setting value,
instruct the switching module to select as the output of the preamplifier system, the transient adjustment line output,
adjust the level of the audio signal through the transient adjustment line according to the new setting value,
detect an absence of change of the setting value,
adjust the level of the audio signal through the steady adjustment line according to the new setting value,
instruct the switching module to connect the output of the steady adjustment line and the output of the transient adjustment line with the output of the preamplifier system,
instruct the switching module to connect the output of the preamplifier system only with the steady adjustment line output.

The steady adjustment line is using a parametric coil transformer digitally controlled.

BRIEF DESCRIPTION OF THE FIGURES

The present invention will be better understood thanks to the attached figures in which.

DETAILED DESCRIPTION

Figure 1:
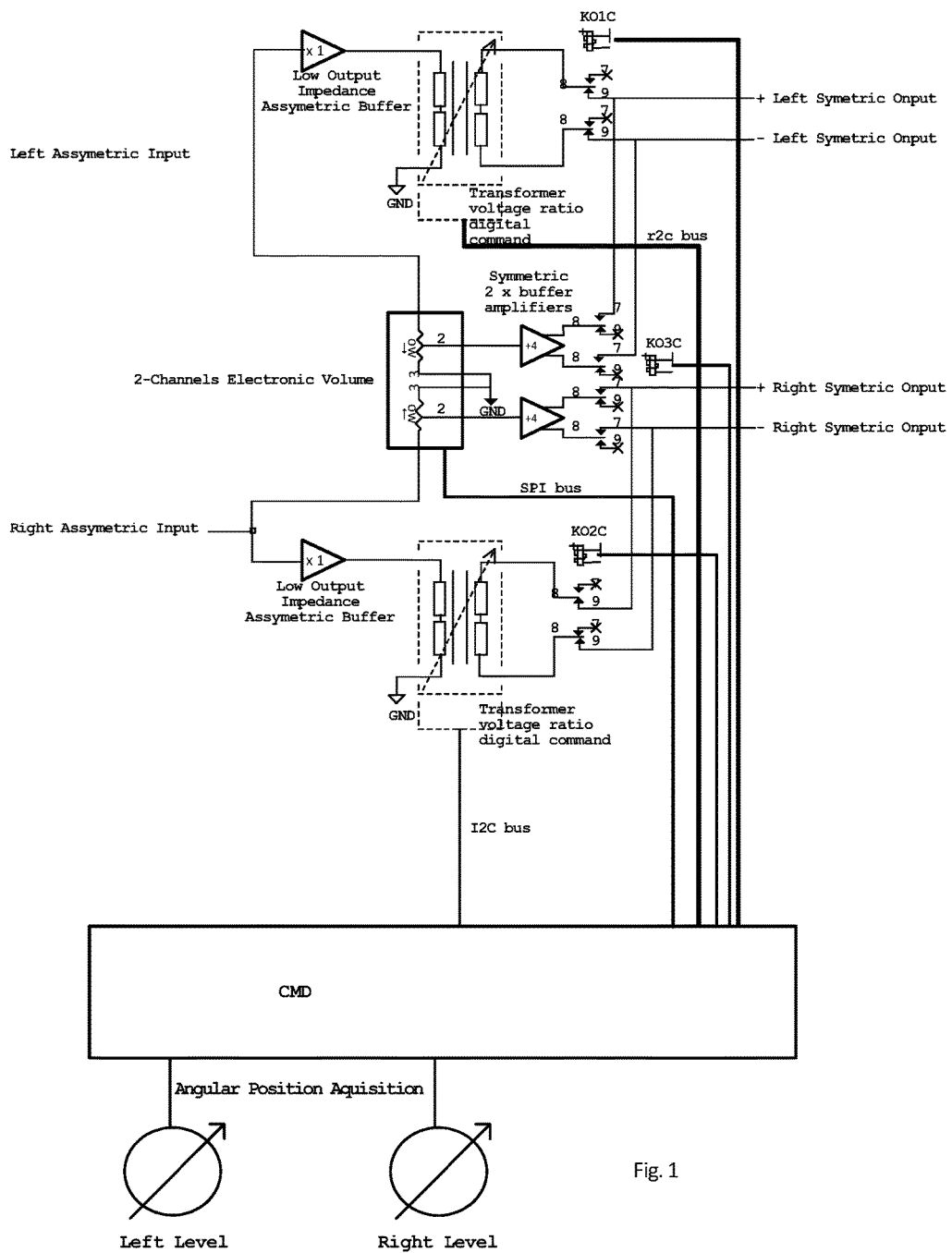
FIG. 1 illustrates the steady adjustment line and the transient adjustment line forming the preamplifier system.

The FIG. 1 illustrates a preamplifier system comprising the steady adjustment line and the transient adjustment line. The transient adjustment line is formed by a conventional symmetric amplifier with digitally adjustable gain. The input of this stage is the same as the input of the steady adjustment line, i.e. Left of Right Asymmetric Input. The gain is adjusted by the digitally programmable resistors DR1 and DR2. The controller CMD has the capacity to send a digital command to adjust the value of the resistor, thus adjusting the gain of the conventional symmetric amplifier.

The steady adjustment line is formed by a coil with multiple windings. The ratio of the number of turns between the primary and the secondary defines the gain. The gain has to be understood as a reduction or an augmentation of the input signal.

The selection of the gain is carried out by the selection of the output or input windings. This selection is more emphasized in the FIG. 2.

In order to drive the coil, a Low Output Impedance Amplifier is used to deliver the necessary current in the input winding.

It is to be noted that the conventional symmetric amplifier and the coil winding selection gives the same gain, so that the signal at the output of the steady line or the transient line is the same for a given selection of gain.

The controller CMD receives a gain setting by a setting device, here represented by a potentiometer (Left Level, Right Level). Various setting devices can be used such as an up/down selector acting on a counter or a conventional potentiometer connected to an analog to digital converter. The controller receives then a digital value representing the desired gain.

In normal condition, the gain is set to a value and not modified. In this case, the controller CMD selects the switching module to connect the output of the coil (the steady line) with the output of the preamplifier. For that purpose, the switching device comprises several relays activated by the controller. For example, the output of the coil is connected with the relay K01C allowing to connect the output of the coil with the output of the preamplifier. In the same manner, the relay K03C allows to connect the output of the conventional amplifier with the output of the preamplifier. In normal operation, when no change is detected in the gain setting, the relay of the conventional amplifier is disconnected and the relay of the coil is connected.

When a change of the gain setting is detected, the controller disconnects the coil from the preamplifier output and connects the conventional amplifier with the preamplifier output. The controller receives the new gain setting and adjusts the digitally controlled resistor (DR1, DR2) of the conventional amplifier accordingly. Each time a modification of the gain setting is detected, the controller modifies the resistor of the conventional amplifier.

When the gain setting is not changed for a while (could be a preprogrammed time delay such as 200 ms), the controller initiates the switch from the conventional amplifier to the coil. The first operation is to define the selection of the windings in order to obtain the new gain defined by the user. The controller selects one or a set of windings so that the ratio from the input to output windings matches the desired gain. A set of relays as illustrated in the FIG. 2 allows various combinations of the windings to obtain the correct gain.

The second operation is to connect in parallel the output of the conventional amplifier with the output of the coil. During this phase, both steady line and transient line are connected with the preamplifier output. Switching windings in a coil could create artifacts and the previously accumulated energy in the coil should be cleared. The output of the conventional amplifier has a low impedance output and will therefore absorb the remaining energy of the coil.

The third operation is to disconnect the conventional amplifier of the preamplifier output to leave only the output of the coil.

Figure 2:
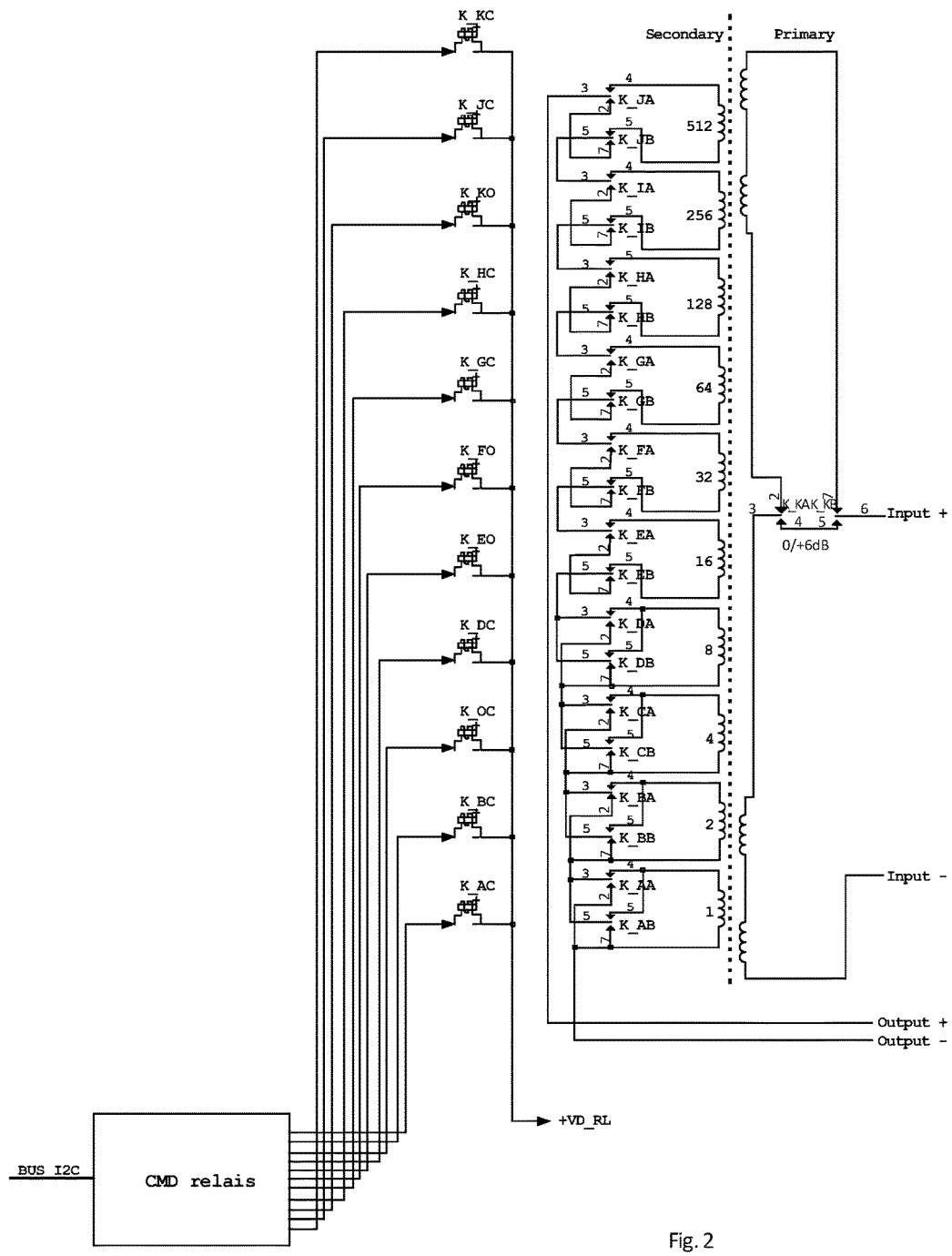
FIG. 2 illustrates the multiple windings coil of the steady adjustment line.

The FIG. 2 illustrates an example of a coil used by the steady adjustment line. On the right side, the primary of the coil comprises two windings in the illustrated example but the primary can comprises one or more windings.

In case of multiple primary windings, the controller can activate relays to connect the input of one winding or to connect two (or more) windings in series.

The secondary of the coil comprises, in the illustrated example, 10 windings defining 1024 combinations. Each winding is connected with a pair of relays controlled by the controller CMD.

The number of turns per windings is different for each winding so that the combination of the windings allows a selection of ratio between the primary winding and the secondary winding(s) with a granularity of 1/1024.

The role of the relays connected to each winding is to connect one of more windings in series. In the table 1 (see below), the first column shows the setting of the coil. The second column shows the resulting attenuation resulting of the ratio between the primary winding and the secondary winding(s).

The columns A to J are the state of the relays for the winding A to J. Since the processing of the gain is logarithmic, no all positions (i.e. maximum 1024) are used. For example, the position 96 results in an attenuation of 14 db. To achieve this result, the relay C, E, F and H are activated. The four windings connected to these relays are then connected in series. The numbers of turns of these windings are added to change the ratio between the primary and the secondary. In the FIG. 2, the relay A is illustrated by the command part K_AC, activated by the controller CMD and the contacts of the relays A are illustrated by K_AA and K_AB connected to both end of the winding. The table 1 gives an example of the number of turns for each winding. The sum of the turns for the windings C, E, F and H is 180. Since the primary winding (K) has 900 turns, the ratio is then 180/900=0.2 i.e. −13.98 dbu.

According to a particular embodiment, the table 2 comprises a further column K representing the state of the relay acting on the primary winding. In our example, the primary of the coil comprises two windings. In a default state (K=0) the two primary windings are connected in series. In case that K=1, only one winding is used to change the conversion ratio of the coil. The presence of two (or more windings) in the primary side of the coil is not necessary but expand the range of selection if needed.

In the example of the FIG. 1, the setting device is a potentiometer in which the value varies linearly. Since the required gain varies according to a logarithmic way, the controller converts the input value obtained from the potentiometer into a logarithm value to determine which windings will be selected.

The use of the steady adjustment line in parallel with a transient adjustment line results in an absence of distortion or delay time in the propagation of the audio signal. Another advantage of the present solution is to allow not only a reduction (or attenuation) of the signal but with the selection of the windings, the coil can also be used to have an amplification of the audio signal (in case that the number of turns in the primary is smaller that the number of turns of the secondary).

TABLE 1

Number of turns for each winding

| K | J | I | H | G | F | E | D | C | B | A |
|---|---|---|---|---|---|---|---|---|---|---|
| 900 | 512 | 256 | 128 | 64 | 32 | 16 | 8 | 4 | 2 | 1 |

TABLE 2

| Position | Attenuation dB | K +6 dB | J 512 | I 256 | H 128 | G 64 | F 32 | E 16 | D 8 | C 4 | B 2 | A 1 |
|---|---|---|---|---|---|---|---|---|---|---|---|---|
| 0 | ∞ | 0 | 0 | 0 | 0 | 0 | 0 | 0 | 0 | 0 | 0 | 0 |
| 1 | −59.1 | 0 | 0 | 0 | 0 | 0 | 0 | 0 | 0 | 0 | 0 | 1 |
| 2 | −59.1 | 0 | 0 | 0 | 0 | 0 | 0 | 0 | 0 | 0 | 0 | 1 |
| 3 | −59.1 | 0 | 0 | 0 | 0 | 0 | 0 | 0 | 0 | 0 | 0 | 1 |
| 4 | −59.1 | 0 | 0 | 0 | 0 | 0 | 0 | 0 | 0 | 0 | 0 | 1 |
| 5 | −59.1 | 0 | 0 | 0 | 0 | 0 | 0 | 0 | 0 | 0 | 0 | 1 |
| 6 | −59.1 | 0 | 0 | 0 | 0 | 0 | 0 | 0 | 0 | 0 | 0 | 1 |
| 7 | −59.1 | 0 | 0 | 0 | 0 | 0 | 0 | 0 | 0 | 0 | 0 | 1 |
| 8 | −59.1 | 0 | 0 | 0 | 0 | 0 | 0 | 0 | 0 | 0 | 0 | 1 |
| 9 | −59.1 | 0 | 0 | 0 | 0 | 0 | 0 | 0 | 0 | 0 | 0 | 1 |
| 10 | −59.1 | 0 | 0 | 0 | 0 | 0 | 0 | 0 | 0 | 0 | 0 | 1 |
| 11 | −59.1 | 0 | 0 | 0 | 0 | 0 | 0 | 0 | 0 | 0 | 0 | 1 |
| 12 | −53.1 | 0 | 0 | 0 | 0 | 0 | 0 | 0 | 0 | 0 | 1 | 0 |
| 13 | −53.1 | 0 | 0 | 0 | 0 | 0 | 0 | 0 | 0 | 0 | 1 | 0 |
| 14 | −53.1 | 0 | 0 | 0 | 0 | 0 | 0 | 0 | 0 | 0 | 1 | 0 |
| 15 | −53.1 | 0 | 0 | 0 | 0 | 0 | 0 | 0 | 0 | 0 | 1 | 0 |
| 16 | −53.1 | 0 | 0 | 0 | 0 | 0 | 0 | 0 | 0 | 0 | 1 | 0 |
| 17 | −53.1 | 0 | 0 | 0 | 0 | 0 | 0 | 0 | 0 | 0 | 1 | 0 |
| 18 | −53.1 | 0 | 0 | 0 | 0 | 0 | 0 | 0 | 0 | 0 | 1 | 0 |
| 19 | −53.1 | 0 | 0 | 0 | 0 | 0 | 0 | 0 | 0 | 0 | 1 | 0 |
| 20 | −53.1 | 0 | 0 | 0 | 0 | 0 | 0 | 0 | 0 | 0 | 1 | 0 |
| 21 | −53.1 | 0 | 0 | 0 | 0 | 0 | 0 | 0 | 0 | 0 | 1 | 0 |
| 22 | −49.5 | 0 | 0 | 0 | 0 | 0 | 0 | 0 | 0 | 0 | 1 | 1 |
| 23 | −49.5 | 0 | 0 | 0 | 0 | 0 | 0 | 0 | 0 | 0 | 1 | 1 |
| 24 | −49.5 | 0 | 0 | 0 | 0 | 0 | 0 | 0 | 0 | 0 | 1 | 1 |
| 25 | −49.5 | 0 | 0 | 0 | 0 | 0 | 0 | 0 | 0 | 0 | 1 | 1 |
| 26 | −49.5 | 0 | 0 | 0 | 0 | 0 | 0 | 0 | 0 | 0 | 1 | 1 |
| 27 | −49.5 | 0 | 0 | 0 | 0 | 0 | 0 | 0 | 0 | 0 | 1 | 1 |
| 28 | −47.0 | 0 | 0 | 0 | 0 | 0 | 0 | 0 | 0 | 1 | 0 | 0 |
| 29 | −47.0 | 0 | 0 | 0 | 0 | 0 | 0 | 0 | 0 | 1 | 0 | 0 |
| 30 | −47.0 | 0 | 0 | 0 | 0 | 0 | 0 | 0 | 0 | 1 | 0 | 0 |
| 31 | −47.0 | 0 | 0 | 0 | 0 | 0 | 0 | 0 | 0 | 1 | 0 | 0 |
| 32 | −45.1 | 0 | 0 | 0 | 0 | 0 | 0 | 0 | 0 | 1 | 0 | 1 |
| 33 | −45.1 | 0 | 0 | 0 | 0 | 0 | 0 | 0 | 0 | 1 | 0 | 1 |
| 34 | −45.1 | 0 | 0 | 0 | 0 | 0 | 0 | 0 | 0 | 1 | 0 | 1 |
| 35 | −45.1 | 0 | 0 | 0 | 0 | 0 | 0 | 0 | 0 | 1 | 0 | 1 |
| 36 | −43.5 | 0 | 0 | 0 | 0 | 0 | 0 | 0 | 0 | 1 | 1 | 0 |
| 37 | −43.5 | 0 | 0 | 0 | 0 | 0 | 0 | 0 | 0 | 1 | 1 | 0 |
| 38 | −43.5 | 0 | 0 | 0 | 0 | 0 | 0 | 0 | 0 | 1 | 1 | 0 |
| 39 | −42.2 | 0 | 0 | 0 | 0 | 0 | 0 | 0 | 0 | 1 | 1 | 1 |
| 40 | −42.2 | 0 | 0 | 0 | 0 | 0 | 0 | 0 | 0 | 1 | 1 | 1 |
| 41 | −41.0 | 0 | 0 | 0 | 0 | 0 | 0 | 0 | 1 | 0 | 0 | 0 |
| 42 | −41.0 | 0 | 0 | 0 | 0 | 0 | 0 | 0 | 1 | 0 | 0 | 0 |
| 43 | −40.0 | 0 | 0 | 0 | 0 | 0 | 0 | 0 | 1 | 0 | 0 | 1 |
| 44 | −40.0 | 0 | 0 | 0 | 0 | 0 | 0 | 0 | 1 | 0 | 0 | 1 |
| 45 | −39.1 | 0 | 0 | 0 | 0 | 0 | 0 | 0 | 1 | 0 | 1 | 0 |
| 46 | −39.1 | 0 | 0 | 0 | 0 | 0 | 0 | 0 | 1 | 0 | 1 | 0 |
| 47 | −38.3 | 0 | 0 | 0 | 0 | 0 | 0 | 0 | 1 | 0 | 1 | 1 |
| 48 | −38.3 | 0 | 0 | 0 | 0 | 0 | 0 | 0 | 1 | 0 | 1 | 1 |
| 49 | −37.5 | 0 | 0 | 0 | 0 | 0 | 0 | 0 | 1 | 1 | 0 | 0 |
| 50 | −36.8 | 0 | 0 | 0 | 0 | 0 | 0 | 0 | 1 | 1 | 0 | 1 |
| 51 | −36.8 | 0 | 0 | 0 | 0 | 0 | 0 | 0 | 1 | 1 | 0 | 1 |
| 52 | −36.2 | 0 | 0 | 0 | 0 | 0 | 0 | 0 | 1 | 1 | 1 | 0 |
| 53 | −35.6 | 0 | 0 | 0 | 0 | 0 | 0 | 0 | 1 | 1 | 1 | 1 |
| 54 | −35.0 | 0 | 0 | 0 | 0 | 0 | 0 | 1 | 0 | 0 | 0 | 0 |
| 55 | −34.5 | 0 | 0 | 0 | 0 | 0 | 0 | 1 | 0 | 0 | 0 | 1 |
| 56 | −34.0 | 0 | 0 | 0 | 0 | 0 | 0 | 1 | 0 | 0 | 1 | 0 |
| 57 | −33.5 | 0 | 0 | 0 | 0 | 0 | 0 | 1 | 0 | 0 | 1 | 1 |
| 58 | −33.1 | 0 | 0 | 0 | 0 | 0 | 0 | 1 | 0 | 1 | 0 | 0 |
| 59 | −32.6 | 0 | 0 | 0 | 0 | 0 | 0 | 1 | 0 | 1 | 0 | 1 |
| 60 | −31.9 | 0 | 0 | 0 | 0 | 0 | 0 | 1 | 0 | 1 | 1 | 1 |
| 61 | −31.5 | 0 | 0 | 0 | 0 | 0 | 1 | 0 | 0 | 0 | 0 | 0 |
| 62 | −31.1 | 0 | 0 | 0 | 0 | 0 | 1 | 1 | 0 | 0 | 0 | 1 |
| 63 | −30.5 | 0 | 0 | 0 | 0 | 0 | 1 | 1 | 0 | 1 | 0 | 1 |
| 64 | −30.1 | 0 | 0 | 0 | 0 | 0 | 1 | 1 | 1 | 0 | 0 | 0 |
| 65 | −29.5 | 0 | 0 | 0 | 0 | 0 | 1 | 1 | 1 | 1 | 0 | 0 |
| 66 | −29.0 | 0 | 0 | 0 | 0 | 1 | 0 | 0 | 0 | 0 | 0 | 0 |
| 67 | −28.5 | 0 | 0 | 0 | 0 | 1 | 0 | 0 | 0 | 0 | 0 | 1 |
| 68 | −28.0 | 0 | 0 | 0 | 0 | 1 | 0 | 0 | 0 | 1 | 0 | 0 |
| 69 | −27.5 | 0 | 0 | 0 | 0 | 1 | 0 | 0 | 0 | 1 | 1 | 0 |
| 70 | −27.0 | 0 | 0 | 0 | 0 | 1 | 0 | 0 | 1 | 0 | 0 | 0 |
| 71 | −26.4 | 0 | 0 | 0 | 0 | 1 | 0 | 1 | 0 | 0 | 1 | 1 |
| 72 | −26.0 | 0 | 0 | 0 | 0 | 1 | 0 | 1 | 1 | 1 | 0 | 1 |
| 73 | −25.5 | 0 | 0 | 0 | 0 | 1 | 1 | 0 | 0 | 0 | 0 | 0 |
| 74 | −24.9 | 0 | 0 | 0 | 0 | 1 | 1 | 0 | 0 | 1 | 1 | 1 |

TABLE 2-continued

| Position | Attenuation dB | K +6 dB | J 512 | I 256 | H 128 | G 64 | F 32 | E 16 | D 8 | C 4 | B 2 | A 1 |
|---|---|---|---|---|---|---|---|---|---|---|---|---|
| 75 | −24.4 | 0 | 0 | 0 | 0 | 0 | 1 | 1 | 0 | 1 | 1 | 0 |
| 76 | −24.0 | 0 | 0 | 0 | 0 | 0 | 1 | 1 | 1 | 0 | 0 | 1 |
| 77 | −23.5 | 0 | 0 | 0 | 0 | 0 | 1 | 1 | 1 | 1 | 0 | 0 |
| 78 | −23.0 | 0 | 0 | 0 | 0 | 1 | 0 | 0 | 0 | 0 | 0 | 0 |
| 79 | −22.6 | 0 | 0 | 0 | 0 | 1 | 0 | 0 | 0 | 0 | 1 | 1 |
| 80 | −22.1 | 0 | 0 | 0 | 0 | 1 | 0 | 0 | 0 | 1 | 1 | 1 |
| 81 | −21.5 | 0 | 0 | 0 | 0 | 1 | 0 | 0 | 1 | 1 | 0 | 0 |
| 82 | −21.0 | 0 | 0 | 0 | 0 | 1 | 0 | 1 | 0 | 0 | 0 | 0 |
| 83 | −20.5 | 0 | 0 | 0 | 0 | 1 | 0 | 1 | 0 | 1 | 0 | 1 |
| 84 | −20.0 | 0 | 0 | 0 | 0 | 1 | 0 | 1 | 1 | 0 | 1 | 0 |
| 85 | −19.5 | 0 | 0 | 0 | 0 | 1 | 0 | 1 | 1 | 1 | 1 | 1 |
| 86 | −19.0 | 0 | 0 | 0 | 0 | 1 | 1 | 0 | 0 | 1 | 0 | 1 |
| 87 | −18.5 | 0 | 0 | 0 | 0 | 1 | 1 | 0 | 1 | 0 | 1 | 1 |
| 88 | −18.0 | 0 | 0 | 0 | 0 | 1 | 1 | 1 | 0 | 0 | 0 | 1 |
| 89 | −17.5 | 0 | 0 | 0 | 0 | 1 | 1 | 1 | 1 | 0 | 0 | 0 |
| 90 | −17.0 | 0 | 0 | 0 | 0 | 1 | 1 | 1 | 1 | 1 | 1 | 1 |
| 91 | −16.5 | 0 | 0 | 0 | 1 | 0 | 0 | 0 | 0 | 1 | 1 | 1 |
| 92 | −16.0 | 0 | 0 | 0 | 1 | 0 | 0 | 0 | 1 | 1 | 1 | 1 |
| 93 | −15.5 | 0 | 0 | 0 | 1 | 0 | 0 | 1 | 0 | 1 | 1 | 1 |
| 94 | −15.0 | 0 | 0 | 0 | 1 | 0 | 1 | 0 | 0 | 0 | 0 | 0 |
| 95 | −14.5 | 0 | 0 | 0 | 1 | 0 | 1 | 0 | 1 | 0 | 1 | 0 |
| 96 | −14.0 | 0 | 0 | 0 | 1 | 0 | 1 | 1 | 0 | 1 | 0 | 0 |
| 97 | −13.5 | 0 | 0 | 0 | 1 | 0 | 1 | 1 | 1 | 1 | 1 | 0 |
| 98 | −13.0 | 0 | 0 | 0 | 1 | 1 | 0 | 0 | 1 | 0 | 1 | 0 |
| 99 | −12.5 | 0 | 0 | 0 | 1 | 1 | 0 | 1 | 0 | 1 | 1 | 0 |
| 100 | −12.0 | 0 | 0 | 0 | 1 | 1 | 1 | 0 | 0 | 0 | 1 | 0 |
| 101 | −11.5 | 0 | 0 | 0 | 1 | 1 | 1 | 1 | 0 | 0 | 0 | 0 |
| 102 | −11.0 | 0 | 0 | 0 | 1 | 1 | 1 | 1 | 1 | 1 | 1 | 0 |
| 103 | −10.5 | 0 | 0 | 1 | 0 | 0 | 0 | 0 | 1 | 1 | 0 | 1 |
| 104 | −9.9 | 0 | 0 | 1 | 0 | 0 | 1 | 0 | 0 | 0 | 0 | 0 |
| 105 | −9.5 | 0 | 0 | 1 | 0 | 0 | 1 | 0 | 1 | 1 | 0 | 1 |
| 106 | −9.0 | 0 | 0 | 1 | 0 | 0 | 1 | 1 | 1 | 1 | 1 | 1 |
| 107 | −8.5 | 0 | 0 | 1 | 0 | 1 | 0 | 1 | 0 | 0 | 1 | 0 |
| 108 | −8.0 | 0 | 0 | 1 | 0 | 1 | 1 | 0 | 0 | 1 | 1 | 0 |
| 109 | −7.5 | 0 | 0 | 1 | 0 | 1 | 1 | 1 | 1 | 0 | 1 | 1 |
| 110 | −7.0 | 0 | 0 | 1 | 1 | 0 | 0 | 1 | 0 | 0 | 1 | 0 |
| 111 | −6.5 | 0 | 0 | 1 | 1 | 0 | 1 | 0 | 1 | 0 | 1 | 0 |
| 112 | −6.0 | 0 | 0 | 1 | 1 | 1 | 0 | 0 | 0 | 0 | 1 | 1 |
| 113 | −5.5 | 0 | 0 | 1 | 1 | 1 | 0 | 1 | 1 | 1 | 1 | 0 |
| 114 | −5.0 | 0 | 0 | 1 | 1 | 1 | 1 | 1 | 1 | 0 | 1 | 0 |
| 115 | −4.5 | 0 | 1 | 0 | 0 | 0 | 0 | 0 | 1 | 0 | 0 | 0 |
| 116 | −4.0 | 0 | 1 | 0 | 0 | 0 | 1 | 1 | 1 | 0 | 0 | 0 |
| 117 | −3.5 | 0 | 1 | 0 | 0 | 1 | 0 | 1 | 1 | 0 | 1 | 0 |
| 118 | −3.0 | 0 | 1 | 0 | 0 | 1 | 1 | 1 | 1 | 1 | 0 | 1 |
| 119 | −2.5 | 0 | 1 | 0 | 1 | 0 | 1 | 0 | 0 | 0 | 1 | 1 |
| 120 | −2.0 | 0 | 1 | 0 | 1 | 1 | 0 | 0 | 1 | 0 | 1 | 1 |
| 121 | −1.5 | 0 | 1 | 0 | 1 | 1 | 1 | 1 | 0 | 1 | 0 | 1 |
| 122 | −1.0 | 0 | 1 | 1 | 0 | 0 | 1 | 0 | 0 | 0 | 1 | 0 |
| 123 | −0.5 | 0 | 1 | 1 | 0 | 1 | 0 | 1 | 0 | 0 | 1 | 0 |
| 124 | 0.0 | 0 | 1 | 1 | 1 | 0 | 0 | 0 | 0 | 1 | 0 | 0 |
| 125 | 0.5 | 0 | 1 | 1 | 1 | 0 | 1 | 1 | 1 | 0 | 0 | 1 |
| 126 | 1.0 | 0 | 1 | 1 | 1 | 1 | 1 | 0 | 0 | 0 | 1 | 0 |
| 127 | 1.5 | 1 | 1 | 0 | 0 | 0 | 0 | 1 | 0 | 1 | 1 | 1 |
| 128 | 2.0 | 1 | 1 | 0 | 0 | 0 | 1 | 1 | 0 | 1 | 1 | 1 |
| 129 | 2.5 | 1 | 1 | 0 | 0 | 1 | 0 | 1 | 1 | 0 | 0 | 0 |
| 130 | 3.0 | 1 | 1 | 0 | 0 | 1 | 1 | 1 | 1 | 0 | 0 | 0 |
| 131 | 3.5 | 1 | 1 | 0 | 1 | 0 | 1 | 0 | 0 | 0 | 0 | 1 |
| 132 | 4.0 | 1 | 1 | 0 | 1 | 1 | 0 | 0 | 1 | 0 | 0 | 1 |
| 133 | 4.5 | 1 | 1 | 0 | 1 | 1 | 1 | 1 | 0 | 1 | 0 | 0 |
| 134 | 5.0 | 1 | 1 | 1 | 0 | 0 | 1 | 0 | 0 | 0 | 0 | 0 |
| 135 | 5.5 | 1 | 1 | 1 | 0 | 1 | 0 | 1 | 0 | 0 | 0 | 0 |
| 136 | 6.0 | 1 | 1 | 1 | 1 | 0 | 0 | 0 | 0 | 1 | 0 | 0 |
| 137 | 6.5 | 1 | 1 | 1 | 1 | 0 | 1 | 1 | 0 | 1 | 1 | 1 |
| 138 | 7.0 | 1 | 1 | 1 | 1 | 1 | 1 | 0 | 1 | 1 | 1 | 1 |
| 139 | 7.1 | 1 | 1 | 1 | 1 | 1 | 1 | 1 | 1 | 1 | 1 | 1 |

The invention claimed is:

1. A preamplifier system to adjust the level of an audio signal, said system comprising a transient adjustment line and a steady adjustment line, each receiving the input of the preamplifier system, each adjustment line having an input and an output, said system further comprising a setting device to produce a setting adjustment value, a controller to receive the setting adjustment value and to control the transient adjustment line and the steady adjustment line, a switching module connected an output of the preamplifier system and to the output of the transient adjustment line and output of the steady adjustment line, the transient adjustment line being made of semiconductors and the steady adjustment line being made of a coil with multiple selectable windings, the controller being configured to:
   detect a change of the setting value;
   instruct the switching module to select as the output of the preamplifier system, the transient adjustment line output;
   adjust the level of the audio signal through the transient adjustment line according to the new setting value;
   detect an absence of change of the setting value;
   adjust the level of the audio signal through the steady adjustment line according to the new setting value;
   instruct the switching module to connect the output of the steady adjustment line and the output of the transient adjustment line with the output of the preamplifier system; and
   instruct the switching module to connect the output of the preamplifier system only with the steady adjustment line output.

2. The preamplifier system of claim 1, wherein the steady adjustment line comprises a low output impedance amplifier to drive at least one input winding of the coil.

3. The preamplifier system of claim 1, wherein each output winding of the coil is connected to a pair of relays controlled by the controller to connect the output of the steady adjustment line with one of more windings in accordance with the setting value.

4. The preamplifier system of claim 2, wherein the coil comprises at least two input windings, each input winding is connected to a pair of relays controlled by the controller to connect the input of the output of the a low output impedance amplifier with one of more input windings in accordance with the setting value.

5. The preamplifier system of claim 1, wherein the setting device produces a linear adjustment value, the controller being configured to convert the linear adjustment value into a logarithm adjustment value, said logarithm adjustment value being used to control the transient adjustment line and the steady adjustment line.

* * * * *